US008879338B2

(12) United States Patent
Hirata

(10) Patent No.: US 8,879,338 B2
(45) Date of Patent: Nov. 4, 2014

(54) SEMICONDUCTOR INTEGRATED CIRCUIT AND NONVOLATILE SEMICONDUCTOR STORAGE DEVICE

(71) Applicant: Kabushiki Kaisha Toshiba, Tokyo (JP)

(72) Inventor: Yoshiharu Hirata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/954,854

(22) Filed: Jul. 30, 2013

(65) Prior Publication Data

US 2014/0211560 A1 Jul. 31, 2014

(30) Foreign Application Priority Data

Jan. 30, 2013 (JP) ................................. 2013-015993

(51) Int. Cl.
*G11C 5/14* (2006.01)
*G05F 1/10* (2006.01)
*G11C 16/06* (2006.01)

(52) U.S. Cl.
CPC .................................... *G11C 16/06* (2013.01)
USPC ........ 365/189.09; 365/226; 327/535; 327/538

(58) Field of Classification Search
USPC .................................................... 365/189.09
See application file for complete search history.

(56) References Cited

U.S. PATENT DOCUMENTS

| 7,376,023 | B2 * | 5/2008 | Umezawa | 365/189.09 |
| 7,733,730 | B2 * | 6/2010 | Hashiba | 365/211 |
| 7,969,795 | B2 * | 6/2011 | Lee | 365/189.09 |
| 8,314,649 | B1 * | 11/2012 | Okamoto | 327/541 |
| 8,582,386 | B2 * | 11/2013 | Byeon | 365/226 |

FOREIGN PATENT DOCUMENTS

| JP | 07-111093 A | 4/1995 |
| JP | 2008-205584 A | 9/2008 |
| JP | 2009-016929 A | 1/2009 |

* cited by examiner

*Primary Examiner* — Son Mai
(74) *Attorney, Agent, or Firm* — Holtz, Holtz, Goodman & Chick PC

(57) ABSTRACT

A semiconductor integrated circuit according to an embodiment includes an oscillator that generates and outputs an oscillation signal in an active state and generates no oscillation signal in an inactive state. The semiconductor integrated circuit includes a negative charge pump that generates an output voltage that is a negative voltage in response to the oscillation signal and outputs the output voltage to an output pad. The semiconductor integrated circuit includes a negative voltage detecting circuit that detects the output voltage and controls the oscillator to be in the active state or inactive state so as to bring the output voltage close to a target voltage.

15 Claims, 9 Drawing Sheets

SEMICONDUCTOR INTEGRATED CIRCUIT AND NONVOLATILE SEMICONDUCTOR STORAGE DEVICE

CROSS-REFERENCE TO RELATED APPLICATION

This application is based upon and claims the benefit of priority from the prior Japanese Patent Application No. 2013-015993, filed on Jan. 30, 2013, the entire contents of which are incorporated herein by reference.

BACKGROUND

1. Field

Embodiments described herein relate generally to a semiconductor integrated circuit and a nonvolatile semiconductor storage device.

2. Background Art

Variations in the output voltage of a negative voltage generating circuit increase if trimming of a detecting resistor is not performed.

Trimming of a detecting resistor requires a special test pad at which a negative voltage is output or input.

DETAILED DESCRIPTION

Figure 1:
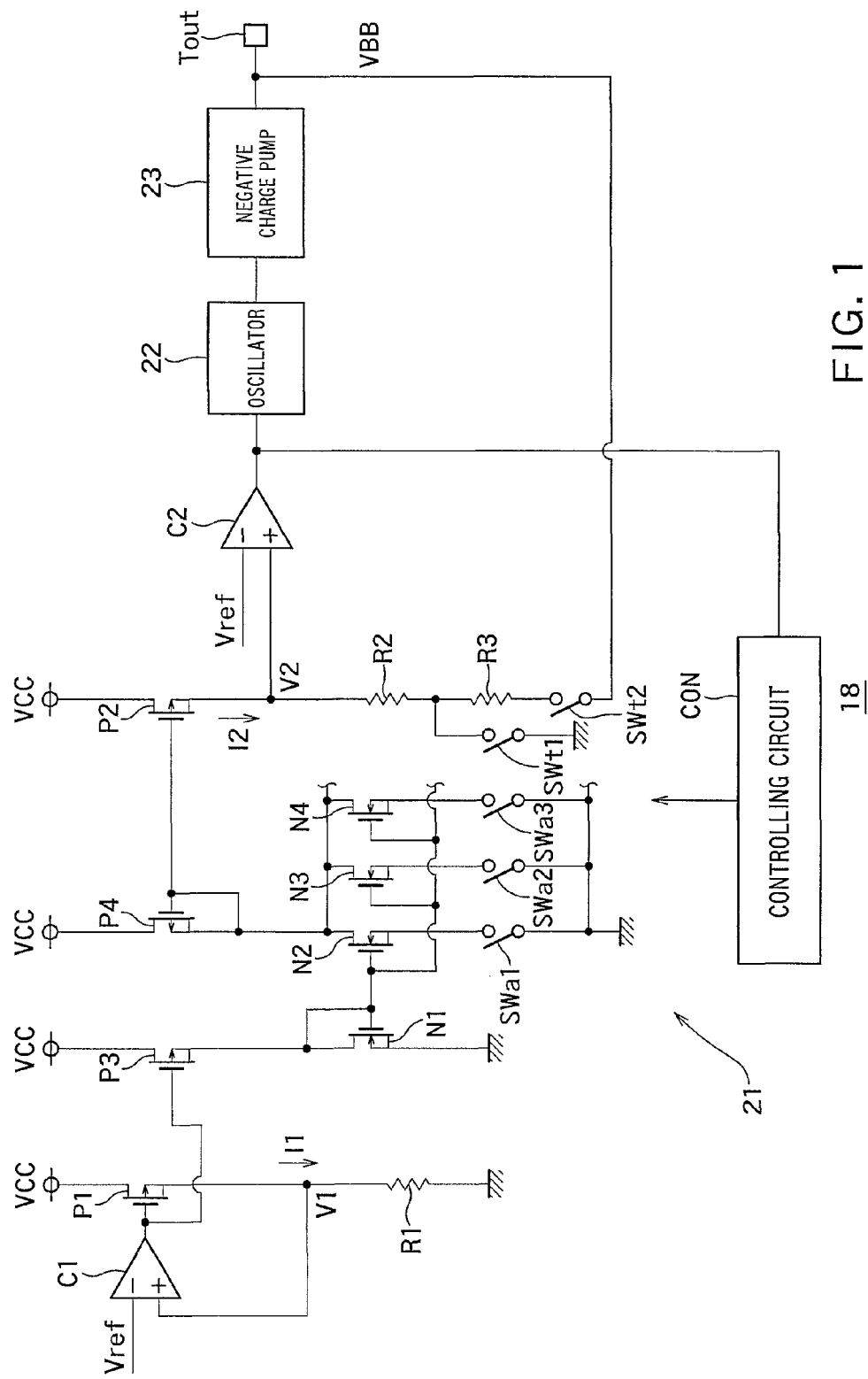
FIG. 1 is a diagram showing an example of a configuration of a semiconductor integrated circuit 18 according to a first embodiment.

A semiconductor integrated circuit according to an embodiment includes an oscillator that generates and outputs an oscillation signal in an active state and generates no oscillation signal in an inactive state. The semiconductor integrated circuit includes a negative charge pump that generates an output voltage that is a negative voltage in response to the oscillation signal and outputs the output voltage to an output pad. The semiconductor integrated circuit includes a negative voltage detecting circuit that detects the output voltage and controls the oscillator to be in the active state or inactive state so as to bring the output voltage close to a target voltage.

The negative voltage detecting circuit has a first pMOS transistor connected to a power supply at a source thereof. The negative voltage detecting circuit has a first resistor connected to a drain of the first pMOS transistor at a first end thereof and to a ground at a second end thereof. The negative voltage detecting circuit has a first comparator that controls a gate voltage of the first pMOS transistor in such a manner that a first voltage between the first end of the first resistor and the drain of the first pMOS transistor is equal to a reference voltage. The negative voltage detecting circuit has a second pMOS transistor that is connected to the power supply at a source thereof and through which a second current, which is a mirror current of a first current flowing through the first pMOS transistor, flows. The negative voltage detecting circuit has a second resistor connected to a drain of the second pMOS transistor at a first end thereof. The negative voltage detecting circuit has a third resistor connected to a second end of the second resistor at a first end thereof and to the output pad at a second end thereof. The negative voltage detecting circuit has a first test switch element connected to the second end of the second resistor at a first end thereof and to the ground at a second end thereof. The negative voltage detecting circuit has a second comparator that compares a second voltage between the first end of the second resistor and the drain of the second pMOS transistor with the reference voltage, outputs an activation signal that activates the oscillator if the second voltage is lower than the reference voltage, and outputs a deactivation signal that deactivates the oscillator if the second voltage is equal to or higher than the reference voltage.

In a test, the negative voltage detecting circuit turns on the first test switch element to perform such a control as to insulate an output of the negative charge pump and the second end of the third resistor from each other or deactivate the negative charge pump, and then changes a value of the second current so as to switch the output of the second comparator from the activation signal to the deactivation signal or from the deactivation signal to the activation signal.

In a normal operation in which the negative charge pump operates in response to the output of the second comparator, the negative voltage detecting circuit turns off the first test switch element and fixes the value of the second current at a value at the time when the switching of the output of the second comparator occurs in the test.

In the following, embodiments will be described with reference to the drawings.

First Embodiment

FIG. 1 is a diagram showing an example of a configuration of a semiconductor integrated circuit 18 according to a first embodiment.

As shown in FIG. 1, the semiconductor integrated circuit (negative voltage system) 18 includes an oscillator 22, a negative charge pump 23 and a negative voltage detecting circuit 21, for example.

The oscillator 22 is configured to generate and output an oscillation signal in an active state and to generate no oscillation signal in an inactive state.

The negative charge pump 23 is configured to generate an output voltage "VBB", which is a negative voltage, in response to the oscillation signal and output the output voltage to an output pad "Tout".

In a normal operation, the negative voltage detecting circuit 21 is configured to detect the output voltage "VBB" and control the oscillator 22 to be in the active or inactive state to bring the output voltage "VBB" close to a target voltage (that is, to bring a second voltage "V2" based on the output voltage "VBB" close to a reference voltage "Vref").

In a test, the negative voltage detecting circuit 21 is configured to output a signal that depends on the result of comparison between the second voltage "V2" and the reference voltage "Vref".

As shown in FIG. 1, the negative voltage detecting circuit 21 includes a first pMOS transistor "P1", a second pMOS transistor "P2", a third pMOS transistor "P3", a fourth pMOS transistor "P4", a first nMOS transistor "N1", a second nMOS transistor "N2", a third nMOS transistor "N3", a fourth nMOS transistor "N4", a first resistor "R1", a second resistor "R2", a third resistor "R3", a first comparator "C1", a second comparator "C2", a first test switch element "SWt1", a second test switch element "SWt2", a first trimming switch element "SWa1", a second trimming switch element "SWa2", a third trimming switch element "SWa3" and a controlling circuit "CON".

The first pMOS transistor "P1" is connected to a power supply "VCC" at the source thereof.

The first resistor "R1" is connected to the drain of the first pMOS transistor "P1" at one end thereof and to a ground at another end thereof.

The first comparator "C1" receives the reference voltage "Vref" at an inverting input terminal thereof and is connected to the one end of the first resistor "R1" at a non-inverting input terminal thereof and to the gate of the first pMOS transistor "P1" at an output thereof.

The first comparator "C1" is configured to control a gate voltage of the first pMOS transistor "P1" so that a first voltage "V1" between the one end of the first resistor "R1" and the drain of the first pMOS transistor "P1" is equal to the reference voltage "Vref".

The second pMOS transistor "P2" is connected to the power supply "VCC" at the source thereof, and a second current "I2", which is a mirror current of a first current "I1" flowing through the first pMOS transistor "P1", flows through the second pMOS transistor "P2".

The second resistor "R2" is connected to the drain of the second pMOS transistor "P2" at one end thereof.

The third resistor "R3" is connected to another end of the second resistor "R2" at one end thereof and to the output pad "Tout" at another end thereof.

The first test switch element "SWt1" is connected to the another end of the second resistor "R2" at one end thereof and to the ground at another end thereof.

The second test switch element "SWt2" is connected between the another end of the third resistor "R3" and the output pad "Tout".

The third pMOS transistor "P3" is connected to the power supply "VCC" at the source thereof and to the output of the first comparator "C1" and the gate of the first pMOS transistor "P1" at the gate thereof.

As with the first pMOS transistor "P1", the third pMOS transistor "P3" is controlled with the output of the first comparator "C1". That is, a current proportional to the first current "I1" flowing through the first pMOS transistor "P1" flows through the third pMOS transistor "P3".

The first nMOS transistor "N1" is connected to the drain of the third pMOS transistor "P3" at the drain thereof and to the ground at the source thereof and is diode-connected.

The current flowing through the third pMOS transistor "P3" flows through the first nMOS transistor "N1".

The fourth pMOS transistor "P4" is connected to the power supply "VCC" at the source thereof and to the gate of the second pMOS transistor at the gate thereof and is diode-connected.

Therefore, a mirror current of the current flowing through the fourth pMOS transistor "P4" is the second current "I2" flowing through the second pMOS transistor "P2".

The second nMOS transistor "N2" is connected to the drain of the fourth pMOS transistor "P4" at the drain thereof and to the gate of the first nMOS transistor "N1" at the gate thereof.

The first trimming switch element "SWa1" is connected between the source of the second nMOS transistor "N2" and the ground.

The third nMOS transistor "N3" is connected to the drain of the fourth pMOS transistor "P4" at the drain thereof and to the gate of the first nMOS transistor "N1" at the gate thereof.

The second trimming switch element "SWa2" is connected between the source of the third nMOS transistor "N3" and the ground.

The fourth nMOS transistor "N4" is connected to the drain of the fourth pMOS transistor "P4" at the drain thereof and to the gate of the first nMOS transistor "N1" at the gate thereof.

The third trimming switch element "SWa3" is connected between the source of the fourth nMOS transistor "N4" and the ground.

The first nMOS transistor "N1" and the second to fourth nMOS transistors "N2" to "N4" form a current mirror circuit.

That is, a mirror current of the current flowing through the first nMOS transistor "N1" flows through the second to fourth nMOS transistors "N2" to "N4".

The mirror ratio of the current mirror circuit can be controlled by controlling turning on and off of the first to third trimming switch elements "SWa1" to "SWa3".

Therefore, any of the first to third trimming switch elements "SWa1" to "SWa3" is turned on, and the sum of the currents flowing through any of the second to fourth nMOS transistors "N2" to "N4" flows through the fourth pMOS transistor "P4".

As described above, the mirror current of the current flowing through the fourth pMOS transistor "P4" is the second current "I2" flowing through the second pMOS transistor "P2".

As a result, as described above, the second current "I2", which is the mirror current of the first current "I1." flowing through the first pMOS transistor "P1", flows through the second pMOS transistor "P2".

The second comparator "C2" receives the reference voltage "Vref" at an inverting input terminal (first input) thereof and is connected to the one end of the second resistor "R2" at a non-inverting input terminal (second input) thereof and to an input of the oscillator 22 at an output thereof.

The second comparator "C2" is configured to compare the second voltage "V2" between the one end of the second resistor "R2" and the drain of the second pMOS transistor "P2" and the reference voltage "Vref".

If the second voltage "V2" is lower than the reference voltage "Vref", the second comparator "C2" is configured to output an activation signal (an output signal at a "High" level) to activate the oscillator 22.

On the other hand, if the second voltage "V2" is equal to or higher than the reference voltage "Vref", the second comparator "C2" is configured to output a deactivation signal (an output signal at a "Low" level) to deactivate the oscillator 22.

The controlling circuit "CON" is configured to control turning on and off of the first to third trimming switch elements "SWt1" to "SWt3" and the first and second test switch elements "SWt1" and "SWt2" based on the output of the second comparator "C2".

That is, the controlling circuit "CON" is configured to detect a switching of the output of the second comparator "C2" and control the value of the second current "I2".

The voltage of the output signal of the second comparator "C2" is a positive voltage. Therefore, the controlling circuit "CON" does not need to have a circuit for detecting a negative voltage in order to detect a switching of the output signal of the second comparator "C2".

For example, in a test for adjusting an offset of the first current "I1", the controlling circuit "CON" is configured to turn on the first test switch element "SWt1" to perform such a control as to insulate the output of the negative charge pump 23 and the another end of the third resistor "R3" from each other or deactivate the negative charge pump 23.

Furthermore, in this test, the controlling circuit "CON" is configured to turn off the second test switch element "SWt2" to perform such a control as to insulate the output of the negative charge pump 23 and the another end of the third resistor "R3" from each other.

Then, the controlling circuit "CON" is configured to change the value of the second current "I2" so as to switch the output of the second comparator "C2" from the activation signal to the deactivation signal or from the deactivation signal to the activation signal.

Furthermore, in the normal operation in which the negative charge pump operates in response to the output of the second comparator, the controlling circuit "CON" is configured to turn off the first test switch element "SWt1" and fix the value of the second current "I2" at the value at the time when the switching of the output of the second comparator "C2" occurs in the test.

Furthermore, in the normal operation, the controlling circuit "CON" is configured to turn on the second test switch element "SWt2" to establish the connection between the output of the negative charge pump 23 and the another end of the third resistor "R3".

In the test, the controlling circuit "CON" may be configured to forcedly deactivate the negative charge pump 23 to bring the output of the negative charge pump 23 to the ground potential. In this case, the second test switch element "SWt2" is omitted.

In this case, again, in the normal operation, the controlling circuit "CON" is configured to control the operational state of the negative charge pump 23 in response to the oscillation signal output from the oscillator 22 in response to the output signal of the second comparator "C2".

Next, an example of an operation of the semiconductor integrated circuit 18 configured as described above will be described.

In the test, the controlling circuit "CON" turns on the first test switch element "SWt1" to perform such a control as to insulate the output of the negative charge pump 23 and the another end of the third resistor "R3" from each other or deactivate the negative charge pump 23.

Furthermore, in this test, the controlling circuit "CON" turns off the second test switch element "SWt2" to perform such a control as to insulate the output of the negative charge pump 23 and the another end of the third resistor "R3" from each other.

In the test, then, the controlling circuit "CON" performs such a control as to turn on or off the first to third trimming switch elements "SWa1" to "SWa3" in such a manner that at least one of the first to third trimming switch elements "SWa1" to "SWa3" is turned on. In this way, the controlling circuit "CON" changes the value of the second current "I2" so as to switch the output of the second comparator "C2" from the activation signal to the deactivation signal or from the deactivation signal to the activation signal.

At this point in time, the controlling circuit "CON" detects the output of the second comparator "C2" and stores the on/off states of the first to third trimming switch elements "SWa1" to "SWa3" at the time when the switching of the output of the second comparator "C2" occurs.

In the normal operation, the controlling circuit "CON" fixes the on/off states of the first to third trimming switch elements "SWa1" to "SWa3" at the states stored in the test. That is, in the normal operation, the controlling circuit "CON" fixes the on/off states of the first to third trimming switch elements "SWa1" to "SWa3" at the states at the time when the switching of the output of the second comparator "C2" occurs in the test. Thus, the value of the second current "I2" is fixed at the value at the time when the switching of the output of the second comparator occurs in the test.

In a case where there are two trimming switch elements, for example, the controlling circuit "CON" performs the following control operations in the test and in the normal operation.

In the test, the controlling circuit "CON" performs such a control as to turn on or off the first and second trimming switch elements "SWa1" and "SWa2" in such a manner that at least one of the first and second trimming switch elements "SWa1" and "SWa2" is turned on.

In this way, the controlling circuit "CON" changes the value of the second current "I2" so as to switch the output of the second comparator "C2" from the activation signal to the deactivation signal or from the deactivation signal to the activation signal.

On the other hand, in the normal operation, the controlling circuit "CON" sets the on/off states of the first and second trimming switch elements "SWa1" and "SWa2" at the states at the time when the switching of the output of the second comparator "C2" occurs in the test. Thus, the value of the second current "I2" is fixed at the value at the time when the switching of the output of the second comparator "C2" occurs in the test.

In a case where the controlling circuit "CON" controls three or more trimming switch elements, the controlling circuit "CON" performs basically the same control operations as those in the case where the controlling circuit "CON" controls two trimming switch elements.

Next, operational characteristics of the semiconductor integrated circuit 18 shown in FIG. 1 will be described.

The output voltage "VBB" in a state where trimming is completed in the normal operation is expressed by the following formula (1). In the formula (1), an offset power supply voltage "Voffset4" is an offset voltage of the reference voltage "Vref" input to the second comparator "C2". Offsets of the resistors "R1" to "R3" are ignored.

$$VBB=(Vref+Voffset4)-(Vref+Voffset4)/R2\times(R2+R3) \quad (1)$$

As shown by the above formula (1), the offset component of the first current "I1" is not included in the output voltage "VBB". That is, the offset of the first current "I1." can be cancelled by trimming of the second current "I2" (adjustment of the mirror ratio through switching of the on/off states of the first to third trimming switch elements "SWt1" to "SWt3").

Thus, the semiconductor integrated circuit 18 does not require a pad for outputting a negative voltage for test. In addition, causes of the offset of the negative voltage detecting circuit 21 in the semiconductor integrated circuit 18 can be reduced.

Figure 2:
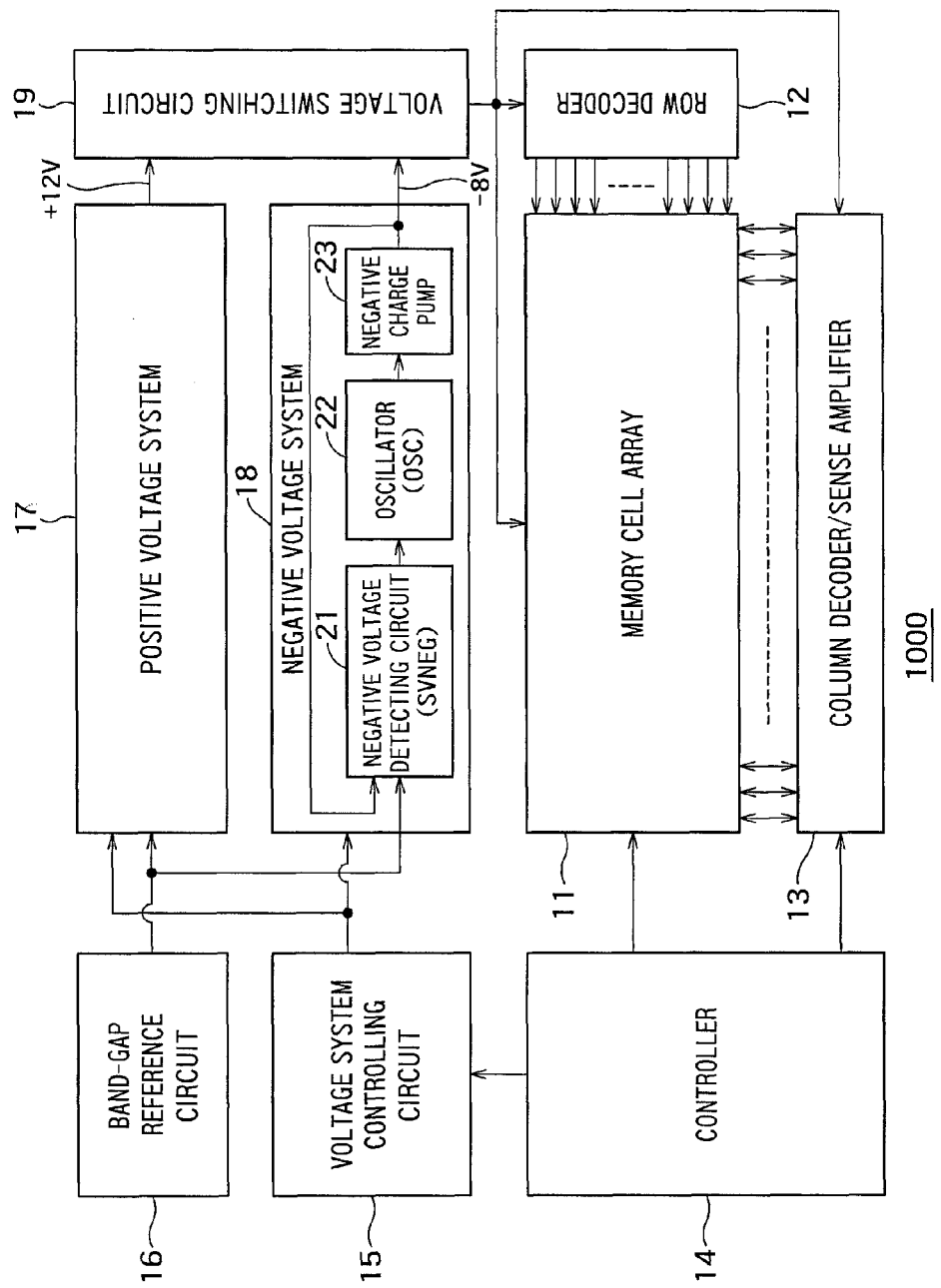
FIG. 2 is a block diagram showing an example of a configuration of a nonvolatile semiconductor storage device 1000 to which the semiconductor integrated circuit (negative voltage system) 18 shown in FIG. 1 is applied.

Next, an example of a device to which the semiconductor integrated circuit (negative voltage system) 18 shown in FIG. 1 is applied will be described. FIG. 2 is a block diagram showing an example of a configuration of a nonvolatile semiconductor storage device 1000 to which the semiconductor integrated circuit (negative voltage system) 18 shown in FIG. 1 is applied.

As shown in FIG. 2, the nonvolatile semiconductor storage device (NOR-type flash memory) 1000 includes a memory cell array 11, a row decoder (address decoder circuit) 12, a column decoder/sense amplifier (selector/data reading circuit) 13, a controller 14, a voltage system controlling circuit (voltage generating controlling circuit) 15, a band-gap reference (BGR) circuit (reference voltage generating circuit) 16, a positive voltage system 17, the negative voltage system (semiconductor integrated circuit) 18 and a voltage switching circuit (power supply output switching circuit) 19.

The memory cell array 11 contains a plurality of nonvolatile memory cells arranged in a row direction and a column direction.

The row decoder 12 selects from among the rows of memory cells, the column decoder/sense amplifier 13 selects from among the columns of memory cells, and data read out to a bit line from the selected memory cell is amplified by the sense amplifier. Alternatively, externally input write data is amplified by the sense amplifier, supplied to a bit line, and then written to the selected memory cell.

The controller 14 controls the operation of the entire flash memory circuit including the memory cell array 11, the column decoder/sense amplifier 13 and the voltage system controlling circuit 15.

The BGR circuit 16 generates a reference voltage "Vref" of 1.25V that has no temperature dependency, for example. The reference voltage "Vref" is supplied to the positive voltage system 17 and the negative voltage system 18.

The voltage system controlling circuit 15 controls operations of the positive voltage system 17 and the negative voltage system 18. The positive voltage system 17 generates a voltage of +12V, for example, and the negative voltage system 18 generates a voltage of −8V, for example.

The negative voltage system 18, which is the semiconductor integrated circuit, includes the negative voltage detecting circuit (SVNEG) 21, the oscillator (OSC: oscillating circuit) 22 and the negative charge pump (negative voltage boosting circuit) 23, for example.

The negative voltage system 18 generates the negative voltage by controlling the boosting operation of the negative charge pump 23 with the oscillation output of the oscillator 22.

The negative voltage generated by the negative charge pump 23 is supplied to the negative voltage detecting circuit 21.

The negative voltage detecting circuit 21 detects the negative voltage by generating a voltage of a positive polarity by supplying the negative voltage to one end of a resistance dividing circuit and flowing a fixed current to another end thereof and comparing, by the second comparator "C2", the voltage of the positive polarity and the reference voltage "Vref" generated by the BGR circuit 16. The oscillation operation of the oscillator 22 is controlled based on the detection result.

The positive voltage output (+12V) of the positive voltage system 17 and the negative voltage output (−8V) of the negative voltage system 18 are supplied to the voltage switching circuit 19.

The voltage switching circuit 19 selects the positive voltage output and the negative voltage output and supplies the outputs to power supply terminals of the memory cell array 11, the row decoder 12 and the column decoder/sense amplifier 13.

Operations of the memory cell array 11, the row decoder 12 and the column decoder/sense amplifier 13 are controlled by the controller 14, and the power supply voltage is selectively switched depending on whether the current operation is the data reading operation, the data writing operation or the data erasing operation, for example.

The semiconductor integrated circuit (negative voltage system) 18 shown in FIG. 1 is applied to the nonvolatile semiconductor storage device 1000 as described above.

As described above, the semiconductor integrated circuit 18 according to the first embodiment can reduce the pads for outputting the negative voltage for test and the causes of the offset of the negative voltage detecting circuit.

Second Embodiment

Figure 3:
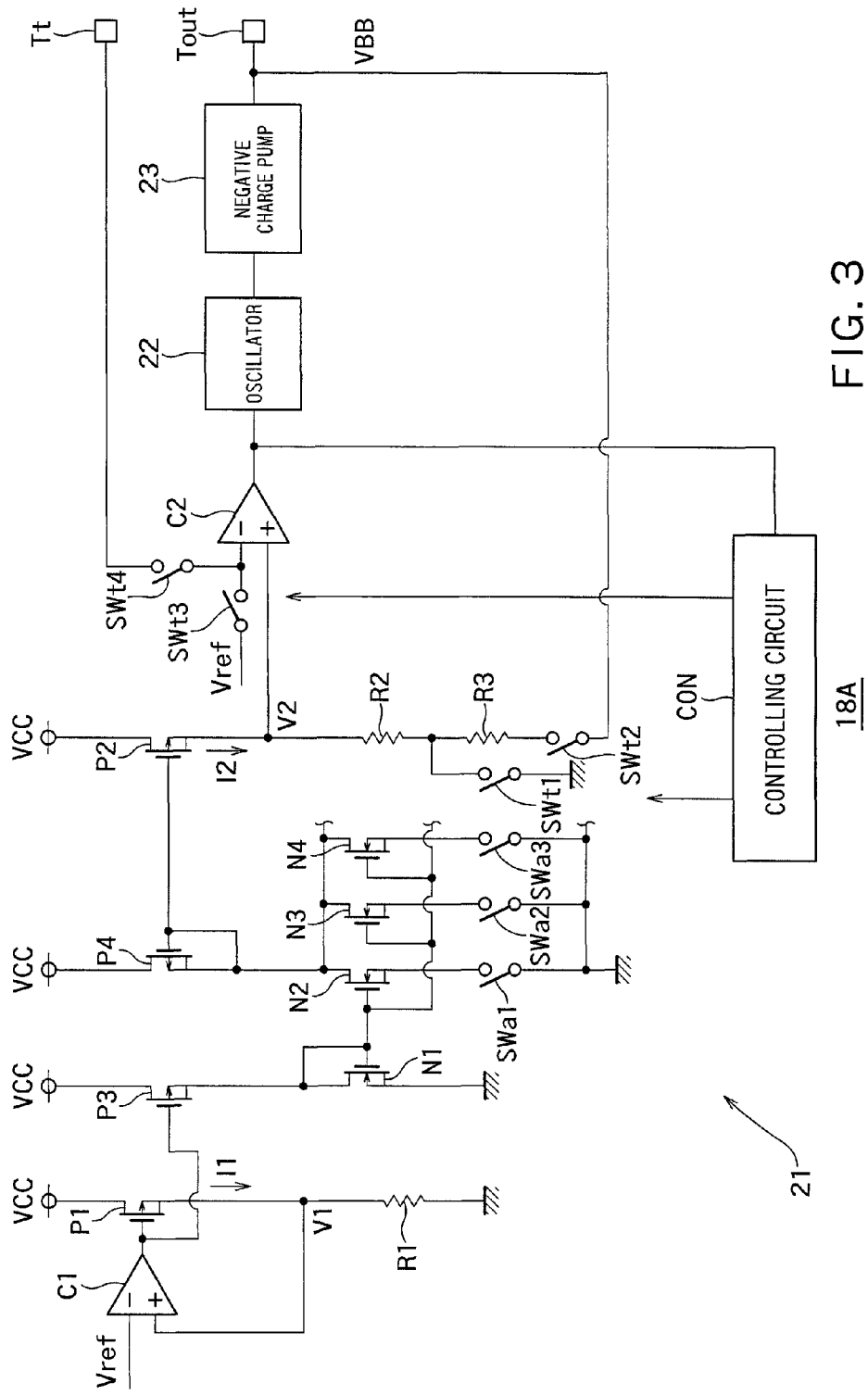
FIG. 3 is a diagram showing an example of a configuration of a semiconductor integrated circuit 18A according to a second embodiment.

FIG. 3 is a diagram showing an example of a configuration of a semiconductor integrated circuit 18A according to a second embodiment. In FIG. 3, the same reference symbols as those in FIG. 1 denote the same components as those in the first embodiment. As with the semiconductor integrated circuit 18 according to the first embodiment described above, the semiconductor integrated circuit 18A according to the second embodiment is applied to the nonvolatile semiconductor storage device 1000 shown in FIG. 2.

As shown in FIG. 3, the semiconductor integrated circuit 18A includes the oscillator 22, the negative charge pump 23 and the negative voltage detecting circuit 21, for example.

Compared with the first embodiment, the negative voltage detecting circuit 21 further includes a third test switch element "SWt3" and a fourth test switch element "SWt4".

The third test switch element "SWt3" receives the reference voltage "Vref" at one end thereof and is connected to the first input of the second comparator "C2" at another end thereof.

The fourth test switch element "SWt4" is connected to the inverting input terminal (first input) of the second comparator "C2" at one end thereof and to a test pad "Tt" at another end thereof.

The second resistor "R2" is connected to the non-inverting input terminal (second input) of the second comparator "C2" at the one end thereof.

The remainder of the configuration of the semiconductor integrated circuit 18A is the same as that of the semiconductor integrated circuit 18 according to the first embodiment.

Next, an example of an operation of the semiconductor integrated circuit 18A configured as described above will be described.

As in the first embodiment, in the test, the controlling circuit "CON" turns on the first test switch element "SWt1" to perform such a control as to insulate the output of the negative charge pump 23 and the another end of the third resistor "R3" from each other or deactivate the negative charge pump 23.

Furthermore, as in the first embodiment, in this test, the controlling circuit "CON" turns off the second test switch element "SWt2" to perform such a control as to insulate the output of the negative charge pump 23 and the another end of the third resistor "R3" from each other.

According to the second embodiment, in the test, a test reference voltage "Vin" is applied to the test pad "Tt". The test reference voltage "Vin" is supplied to the test pad "Tt" from an external tester (not shown). Then, the controlling circuit "CON" turns off the third test switch element "SWt3" and turns on the fourth test switch element "SWt4".

As a result, the test reference voltage "Vin" is supplied to the inverting input terminal of the second comparator "C2".

Then, as in the first embodiment, in the test, the controlling circuit "CON" performs such a control as to turn on or off the first to third trimming switch elements "SWa1" to "SWa3" in such a manner that at least one of the first to third trimming switch elements "SWa1" to "SWa3" is turned on. In this way, the controlling circuit "CON" changes the value of the second current "I2" so as to switch the output of the second comparator "C2" from the activation signal to the deactivation signal or from the deactivation signal to the activation signal.

At this point in time, as in the first embodiment, the controlling circuit "CON" detects the output of the second comparator "C2" and stores the on/off states of the first to third trimming switch elements "SWa1" to "SWa3" at the time when the switching of the output of the second comparator "C2" occurs.

As in the first embodiment, in the normal operation, the controlling circuit "CON" fixes the on/off states of the first to third trimming switch elements "SWa1" to "SWa3" at the states stored in the test.

That is, in the normal operation, the controlling circuit "CON" fixes the on/off states of the first to third trimming switch elements "SWa1" to "SWa3" at the states at the time when the switching of the output of the second comparator "C2" occurs in the test.

Thus, the value of the second current "I2" is fixed at the value at the time when the switching of the output of the second comparator "C2" occurs in the test.

Furthermore, in the normal operation, the controlling circuit "CON" turns on the third test switch element "SWt3" and turns off the fourth test switch element "SWt4".

As a result, the reference voltage "Vref" is supplied to the inverting input terminal of the second comparator "C2".

Next, operational characteristics of the semiconductor integrated circuit 18A shown in FIG. 3 will be described.

The output voltage "VBB" in the state where trimming is completed in the normal operation is expressed by the following formula (2). Offsets of the resistors "R1" to "R3" are ignored.

$$VBB = Vref - Vin/R2 \times (R2+R3) \qquad (2)$$

As can be seen from the above formula (2), if (R2+R3)/R2 is sufficiently great, the output voltage "VBB" can be controlled with the test reference voltage "Vin".

Furthermore, as described above, as in the first embodiment, the offset component of the first current "I1" is not included in the output voltage "VBB". That is, the offset of the first current "I1" can be cancelled by trimming of the second current "I2" (adjustment of the mirror ratio through switching of the on/off states of the first to third trimming switch elements "SWt1" to "SWt3").

Thus, the semiconductor integrated circuit 18A does not require a pad for outputting a negative voltage for test. In addition, causes of the offset of the negative voltage detecting circuit 21 in the semiconductor integrated circuit 18A can be reduced.

As described above, as with the semiconductor integrated circuit 18 according to the first embodiment, the semiconductor integrated circuit 18A according to the second embodiment can reduce the pads for outputting the negative voltage for test and the causes of the offset of the negative voltage detecting circuit.

Third Embodiment

Figure 4:
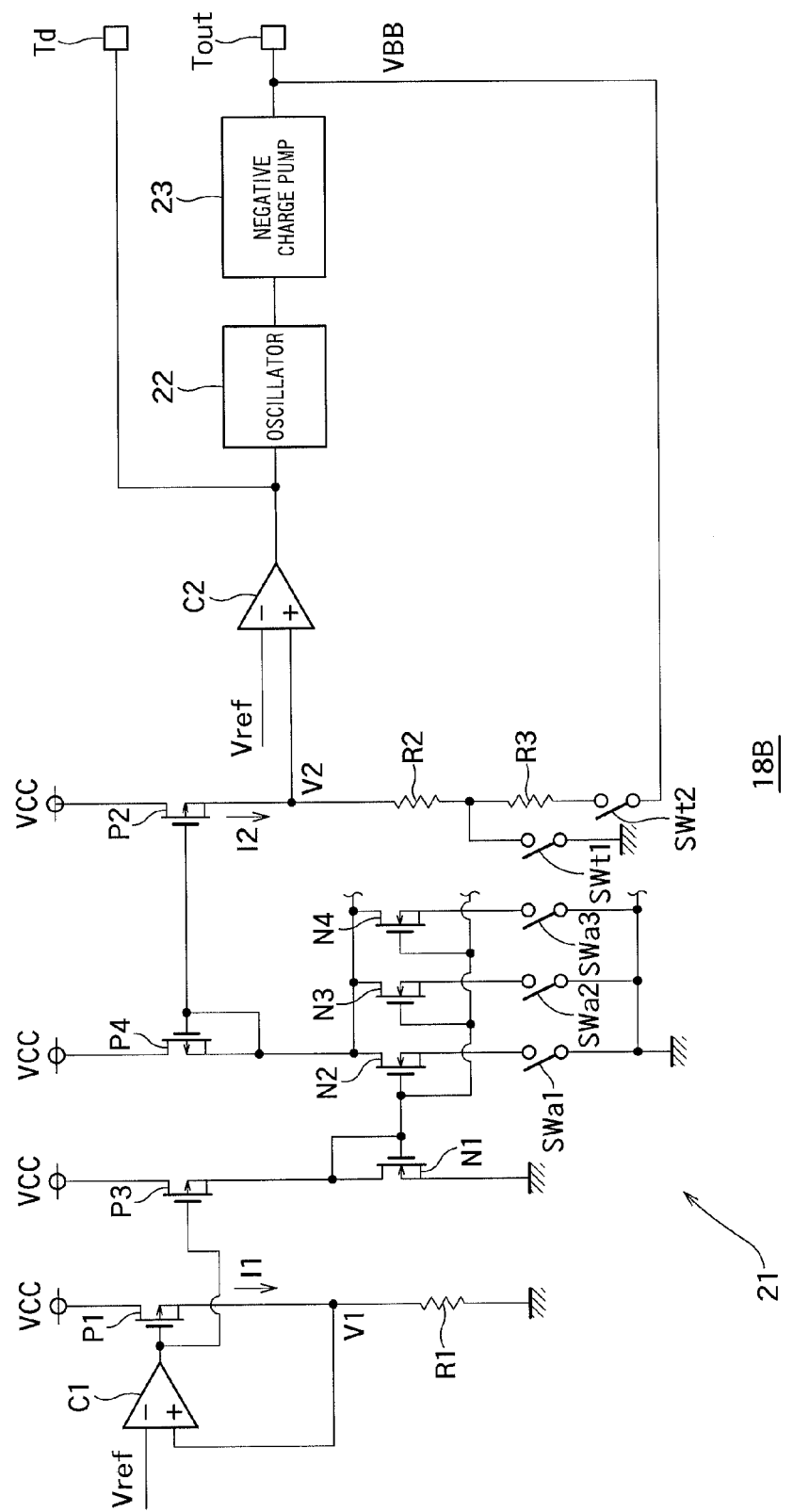
FIG. 4 is a diagram showing an example of a configuration of a semiconductor integrated circuit 18B according to a third embodiment.

FIG. 4 is a diagram showing an example of a configuration of a semiconductor integrated circuit 18B according to a third embodiment. In FIG. 4, the same reference symbols as those in FIG. 1 denote the same components as those in the first embodiment.

As shown in FIG. 4, the semiconductor integrated circuit 18B includes the oscillator 22, the negative charge pump 23 and the negative voltage detecting circuit 21, for example, as with the semiconductor integrated circuit 18 according to the first embodiment.

As with the semiconductor integrated circuit 18 according to the first embodiment described above, the semiconductor integrated circuit 18B according to the third embodiment is applied to the nonvolatile semiconductor storage device 1000 shown in FIG. 2.

Compared with the first embodiment, the negative voltage detecting circuit 21 does not include the controlling circuit "CON". The control operation that would otherwise be performed by the controlling circuit "CON" is performed by a testing apparatus (not shown) external to the semiconductor integrated circuit 18B.

Furthermore, compared with the first embodiment, the negative voltage detecting circuit 21 further includes a detecting pad "Td".

The detecting pad "Td" is connected to the output of the second comparator "C2" and is configured to output the output signal of the second comparator "C2" to the outside.

The testing apparatus described above is configured to detect a switching of the output of the second comparator "C2" based on a signal at the detecting pad "Td".

The voltage at the detecting pad "Td" is the voltage of the output signal of the second comparator "C2" and therefore is a positive voltage. Therefore, the testing apparatus does not need to have a circuit for detecting a negative voltage in order to detect the voltage at the detecting pad "Td".

The remainder of the configuration of the semiconductor integrated circuit 18B is the same as that of the semiconductor integrated circuit 18 according to the first embodiment.

Next, an example of an operation of the semiconductor integrated circuit 18B configured as described above will be described.

In the test, the testing apparatus turns on the first test switch element "SWt1" to perform such a control as to insulate the output of the negative charge pump 23 and the another end of the third resistor "R3" from each other or deactivate the negative charge pump 23.

Furthermore, in this test, the testing apparatus turns off the second test switch element "SWt2" to perform such a control as to insulate the output of the negative charge pump 23 and the another end of the third resistor "R3" from each other.

Then, in the test, the testing apparatus performs such a control as to turn on or off the first to third trimming switch elements "SWa1" to "SWa3" in such a manner that at least one of the first to third trimming switch elements "SWa1" to "SWa3" is turned on. In this way, the testing apparatus changes the value of the second current "I2" so as to switch the output of the second comparator "C2" from the activation signal to the deactivation signal or from the deactivation signal to the activation signal.

At this point in time, the testing apparatus detects the output of the second comparator "C2" and stores the on/off states of the first to third trimming switch elements "SWa1" to "SWa3" at the time when the switching of the output of the second comparator "C2" occurs.

Then, the testing apparatus fixes the on/off states of the first to third trimming switch elements "SWa1" to "SWa3" at the states stored in the test.

Thus, in the normal operation, the on/off states of the first to third trimming switch elements "SWa1" to "SWa3" are fixed at the states stored in the test. That is, in the normal operation, the on/off states of the first to third trimming switch elements "SWa1" to "SWa3" are fixed at the states at the time when the switching of the output of the second comparator "C2" occurs in the test. As a result, the value of the second current "I2" is fixed at the value at the time when the switching of the output of the second comparator "C2" occurs in the test.

The operational characteristics of the semiconductor integrated circuit 18B are the same as those of the semiconductor integrated circuit 18 according to the first embodiment.

That is, as with the semiconductor integrated circuit 18 according to the first embodiment, the semiconductor integrated circuit 18B according to the third embodiment can reduce the pads for outputting the negative voltage for test and the causes of the offset of the negative voltage detecting circuit.

Fourth Embodiment

Figure 5:
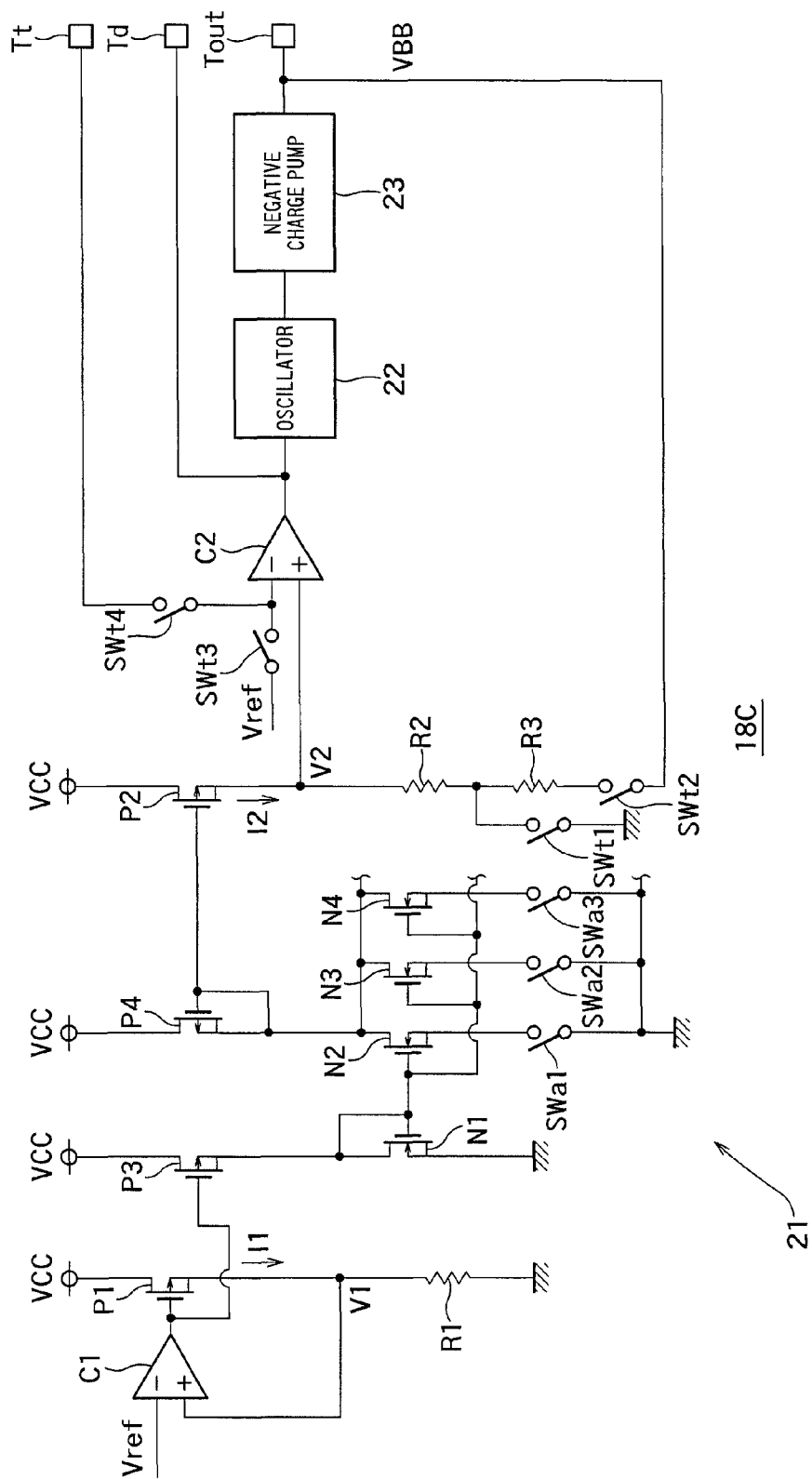
FIG. 5 is a diagram showing an example of a configuration of a semiconductor integrated circuit 18C according to a fourth embodiment.

FIG. 5 is a diagram showing an example of a configuration of a semiconductor integrated circuit 18C according to a fourth embodiment. In FIG. 5, the same reference symbols as those in FIGS. 3 and 4 denote the same components as those in the second and third embodiments.

As shown in FIG. 5, the semiconductor integrated circuit 18C includes the oscillator 22, the negative charge pump 23 and the negative voltage detecting circuit 21, for example, as with the semiconductor integrated circuit 18B according to the second embodiment.

As with the semiconductor integrated circuit 18B according to the second embodiment described above, the semiconductor integrated circuit 18C according to the fourth embodiment is applied to the nonvolatile semiconductor storage device 1000 shown in FIG. 2.

Compared with the second embodiment, the negative voltage detecting circuit 21 does not include the controlling circuit "CON". The control operation that would otherwise be performed by the controlling circuit "CON" is performed by a testing apparatus (not shown) external to the semiconductor integrated circuit 18C.

As in the third embodiment, the negative voltage detecting circuit 21 further includes the detecting pad "Td".

The remainder of the configuration of the semiconductor integrated circuit 18C is the same as those of the semiconductor integrated circuits 18A and 18B according to the second and third embodiments.

According to the fourth embodiment, in the test, the test reference voltage "Vin" is applied to the test pad "Tt". The test reference voltage "Vin" is supplied to the test pad "Tt" from an external tester (not shown). Then, the testing apparatus turns off the third test switch element "SWt3" and turns on the fourth test switch element "SWt4".

As a result, the test reference voltage "Vin" is supplied to the inverting input terminal of the second comparator "C2".

Furthermore, in the normal operation, the testing apparatus turns on the third test switch element "SWt3" and turns off the fourth test switch element "SWt4".

As a result, in the normal operation, the reference voltage "Vref" is supplied to the inverting input terminal of the second comparator "C2".

In the remainder of the operation of the semiconductor integrated circuit 18C, the external testing apparatus performs the controlling operation instead of the controlling circuit "CON".

The operational characteristics of the semiconductor integrated circuit 18C are the same as those of the semiconductor integrated circuit 18B according to the second embodiment.

That is, as with the semiconductor integrated circuit 18 according to the first embodiment, the semiconductor integrated circuit 18C according to the fourth embodiment can reduce the pads for outputting the negative voltage for test and the causes of the offset of the negative voltage detecting circuit.

Fifth Embodiment

Figure 6:
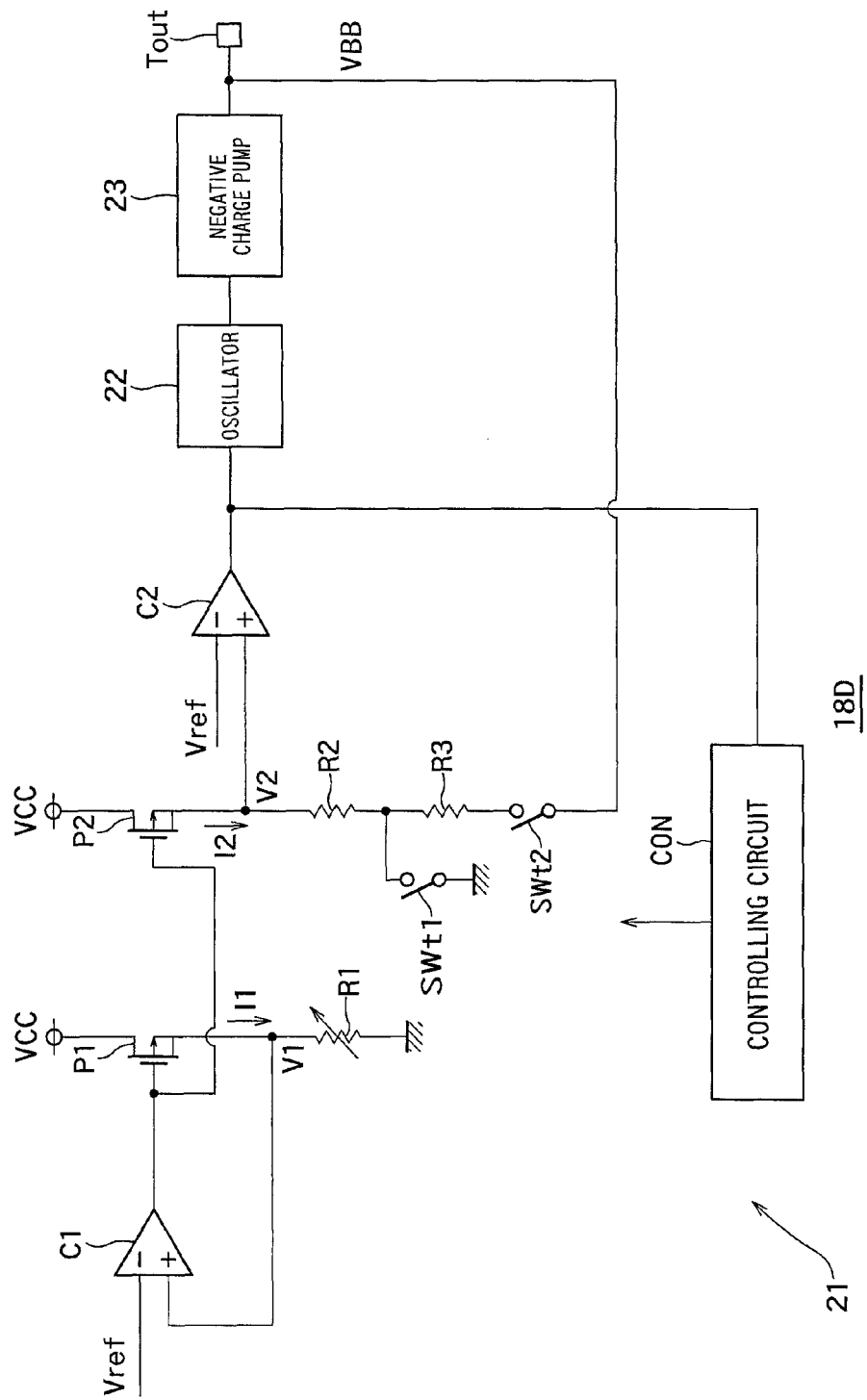
FIG. 6 is a diagram showing an example of a configuration of a semiconductor integrated circuit 18D according to a fifth embodiment.

FIG. 6 is a diagram showing an example of a configuration of a semiconductor integrated circuit 18D according to a fifth embodiment. In FIG. 6, the same reference symbols as those in FIG. 1 denote the same components as those in the first embodiment.

As shown in FIG. 6, the semiconductor integrated circuit 18D includes the oscillator 22, the negative charge pump 23 and the negative voltage detecting circuit 21, for example.

As with the semiconductor integrated circuit 18 according to the first embodiment described above, the semiconductor integrated circuit 18D according to the fifth embodiment is applied to the nonvolatile semiconductor storage device 1000 shown in FIG. 2.

As shown in FIG. 6, the negative voltage detecting circuit 21 includes the first pMOS transistor "P1", the second pMOS transistor "P2", the first resistor "R1", the second resistor "R2", the third resistor "R3", the first comparator "C1", the second comparator "C2", the first test switch element "SWt1", the second test switch element "SWt2" and the controlling circuit "CON".

That is, compared with the first embodiment, the negative voltage detecting circuit 21 according to the fifth embodiment does not include the third and fourth pMOS transistors "P3" and "P4", the first to fourth nMOS transistors "N1" to "N4" and the first to third trimming switch elements "SWa1" to "SWa3".

According to the fifth embodiment, the first resistor "R1" is a variable resistor.

In the test, the controlling circuit "CON" is configured to control the resistance of the first resistor "R1" to change the first current "I1". In this way, the controlling circuit "CON" changes the value of the second current "I2" so as to switch the output of the second comparator "C2" from the activation signal to the deactivation signal or from the deactivation signal to the activation signal.

In the normal operation, the controlling circuit "CON" is configured to fix the value of the current through the first resistor "R1" at the value at the time when the switching of the output of the second comparator "C2" occurs in the test. In this way, the controlling circuit "CON" fixes the value of the second current "I2" at the value at the time when the switching of the output of the second comparator "C2" occurs in the test.

The remainder of the semiconductor integrated circuit 18D is the same as that of the semiconductor integrated circuit 18 according to the first embodiment.

Next, an example of an operation of the semiconductor integrated circuit 18D configured as described above will be described.

As in the first embodiment, in the test, the controlling circuit "CON" turns on the first test switch element "SWt1" to perform such a control as to insulate the output of the negative charge pump 23 and the another end of the third resistor "R3" from each other or deactivate the negative charge pump 23.

Furthermore, as in the first embodiment, in this test, the controlling circuit "CON" turns off the second test switch element "SWt2" to perform such a control as to insulate the output of the negative charge pump 23 and the another end of the third resistor "R3" from each other.

In this test, then, the controlling circuit "CON" controls the resistance of the first resistor "R1" to change the first current "I1". In this way, the controlling circuit "CON" changes the second current "I2" so as to switch the output of the second comparator "C2" from the activation signal to the deactivation signal or from the deactivation signal to the activation signal.

As in the first embodiment, in the normal operation, the controlling circuit "CON" fixes the value of the current through the first resistor "R1" at the state stored in the test.

That is, in the normal operation, the controlling circuit "CON" fixes the value of the current through the first resistor "R1" at the value at the time when the switching of the output of the second comparator "C2" occurs in the test.

As a result, the value of the second current "I2" is fixed at the value at the time when the switching of the output of the second comparator "C2" occurs in the test.

The operational characteristics of the semiconductor integrated circuit 18D shown in FIG. 6 are the same as those of the semiconductor integrated circuit 18 according to the first embodiment.

That is, as with the semiconductor integrated circuit 18 according to the first embodiment, the semiconductor integrated circuit 18D according to the fifth embodiment can reduce the pads for outputting the negative voltage for test and the causes of the offset of the negative voltage detecting circuit.

Sixth Embodiment

Figure 7:
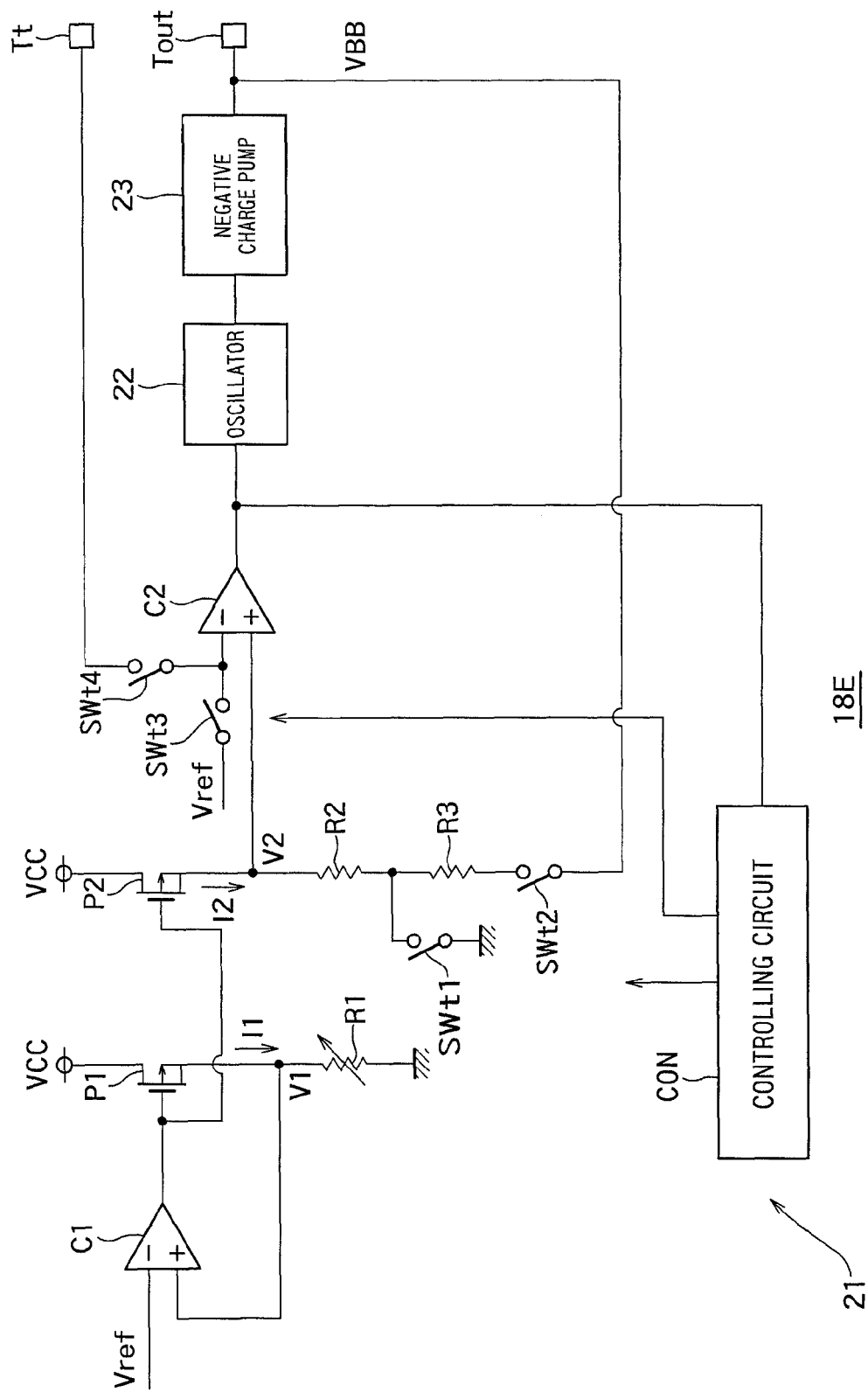
FIG. 7 is a diagram showing an example of a configuration of a semiconductor integrated circuit 18E according to a sixth embodiment.

FIG. 7 is a diagram showing an example of a configuration of a semiconductor integrated circuit 18E according to a sixth embodiment. In FIG. 7, the same reference symbols as those in FIGS. 4 and 6 denote the same components as those in the third and fifth embodiments.

As shown in FIG. 7, the semiconductor integrated circuit 18E includes the oscillator 22, the negative charge pump 23 and the negative voltage detecting circuit 21, for example, as with the semiconductor integrated circuit 18D according to the fifth embodiment.

As with the semiconductor integrated circuit 18 according to the first embodiment described above, the semiconductor integrated circuit 18E according to the sixth embodiment is applied to the nonvolatile semiconductor storage device 1000 shown in FIG. 2.

As in the third embodiment, the negative voltage detecting circuit 21 further includes the detecting pad "Td".

The remainder of the configuration of the semiconductor integrated circuit 18E is the same as those of the semiconductor integrated circuits 18B and 18D according to the third and fifth embodiments.

Next, an example of an operation of the semiconductor integrated circuit 18E configured as described above will be described.

As in the first embodiment, in the test, the controlling circuit "CON" turns on the first test switch element "SWt1" to perform such a control as to insulate the output of the negative charge pump 23 and the another end of the third resistor "R3" from each other or deactivate the negative charge pump 23.

Furthermore, as in the first embodiment, in this test, the controlling circuit "CON" turns off the second test switch element "SWt2" to perform such a control as to insulate the output of the negative charge pump 23 and the another end of the third resistor "R3" from each other.

Furthermore, in this test, the test reference voltage "Vin" is applied to the test pad "Tt". The test reference voltage "Vin" is supplied to the test pad "Tt" from an external tester (not shown). Then, the controlling circuit "CON" turns off the third test switch element "SWt3" and turns on the fourth test switch element "SWt4".

As a result, the test reference voltage "Vin" is supplied to the inverting input terminal of the second comparator "C2".

In this test, then, as in the first embodiment, the controlling circuit "CON" controls the resistance of the first resistor "R1" to change the first current "I1". In this way, the controlling circuit "CON" changes the value of the second current "I2" so as to switch the output of the second comparator "C2" from the activation signal to the deactivation signal or from the deactivation signal to the activation signal.

As in the first embodiment, in the normal operation, the controlling circuit "CON" fixes the value of the current through the first resistor "R1" at the value at the time when the switching of the output of the second comparator "C2" occurs in the test.

That is, in the normal operation, the controlling circuit "CON" fixes the value of the current through the first resistor "R1" at the state at the time when the switching of the output of the second comparator "C2" occurs in the test.

As a result, the value of the second current "I2" is fixed at the value at the time when the switching of the output of the second comparator "C2" occurs in the test.

Furthermore, in the normal operation, the controlling circuit "CON" turns on the third test switch element "SWt3" and turns off the fourth test switch element "SWt4".

As a result, the reference voltage "Vref" is supplied to the inverting input terminal of the second comparator "C2".

The operational characteristics of the semiconductor integrated circuit 18E shown in FIG. 7 are the same as those of the semiconductor integrated circuit 18D according to the fifth embodiment.

That is, as with the semiconductor integrated circuit 18D according to the fifth embodiment, the semiconductor integrated circuit 18E according to the sixth embodiment can reduce the pads for outputting the negative voltage for test and the causes of the offset of the negative voltage detecting circuit.

Seventh Embodiment

Figure 8:
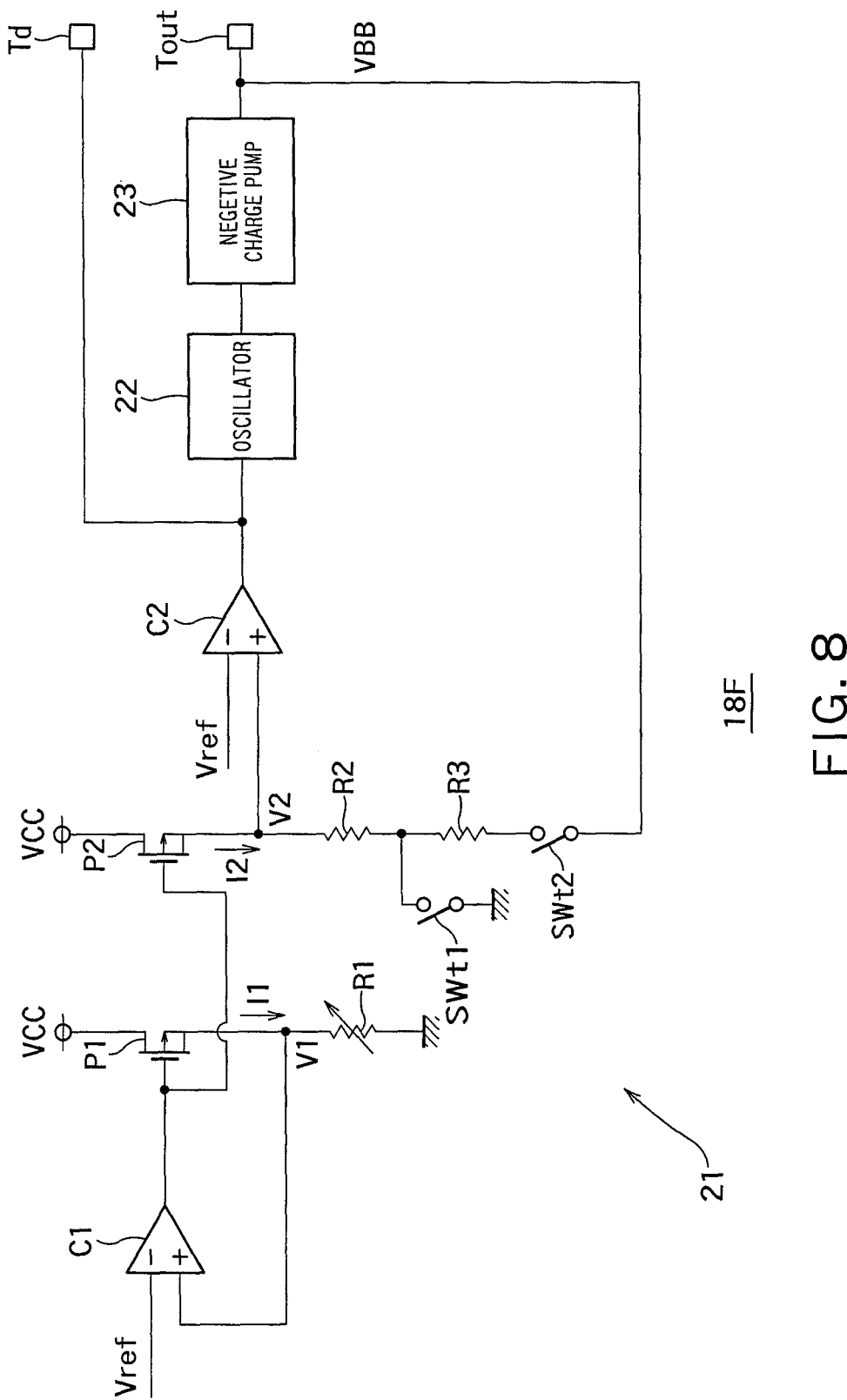
FIG. 8 is a diagram showing an example of a configuration of a semiconductor integrated circuit 18F according to a seventh embodiment.

FIG. 8 is a diagram showing an example of a configuration of a semiconductor integrated circuit 18F according to a seventh embodiment. In FIG. 8, the same reference symbols as those in FIGS. 4 and 6 denote the same components as those in the third and fifth embodiments.

As shown in FIG. 8, the semiconductor integrated circuit 18F includes the oscillator 22, the negative charge pump 23 and the negative voltage detecting circuit 21, for example.

As with the semiconductor integrated circuit 18 according to the first embodiment described above, the semiconductor integrated circuit 18F according to the seventh embodiment is applied to the nonvolatile semiconductor storage device 1000 shown in FIG. 2.

Compared with the fifth embodiment, the negative voltage detecting circuit 21 does not include the controlling circuit "CON". The control operation that would otherwise be performed by the controlling circuit "CON" is performed by a testing apparatus (not shown) external to the semiconductor integrated circuit 18F, as in the third embodiment.

The remainder of the configuration of the semiconductor integrated circuit 18F is the same as those of the semiconductor integrated circuits 18B and 18D according to the third and fifth embodiments.

The control operation of the semiconductor integrated circuit 18F is the same as that of the semiconductor integrated circuit 18D according to the fifth embodiment except that the testing apparatus (not shown) external to the semiconductor integrated circuit 18F performs the controlling operation instead of the controlling circuit "CON".

The operational characteristics of the semiconductor integrated circuit 18F are the same as those of the semiconductor integrated circuit 18D according to the fifth embodiment.

That is, as with the semiconductor integrated circuit 18D according to the fifth embodiment, the semiconductor integrated circuit 18F according to the seventh embodiment can reduce the pads for outputting the negative voltage for test and the causes of the offset of the negative voltage detecting circuit.

Eighth Embodiment

Figure 9:
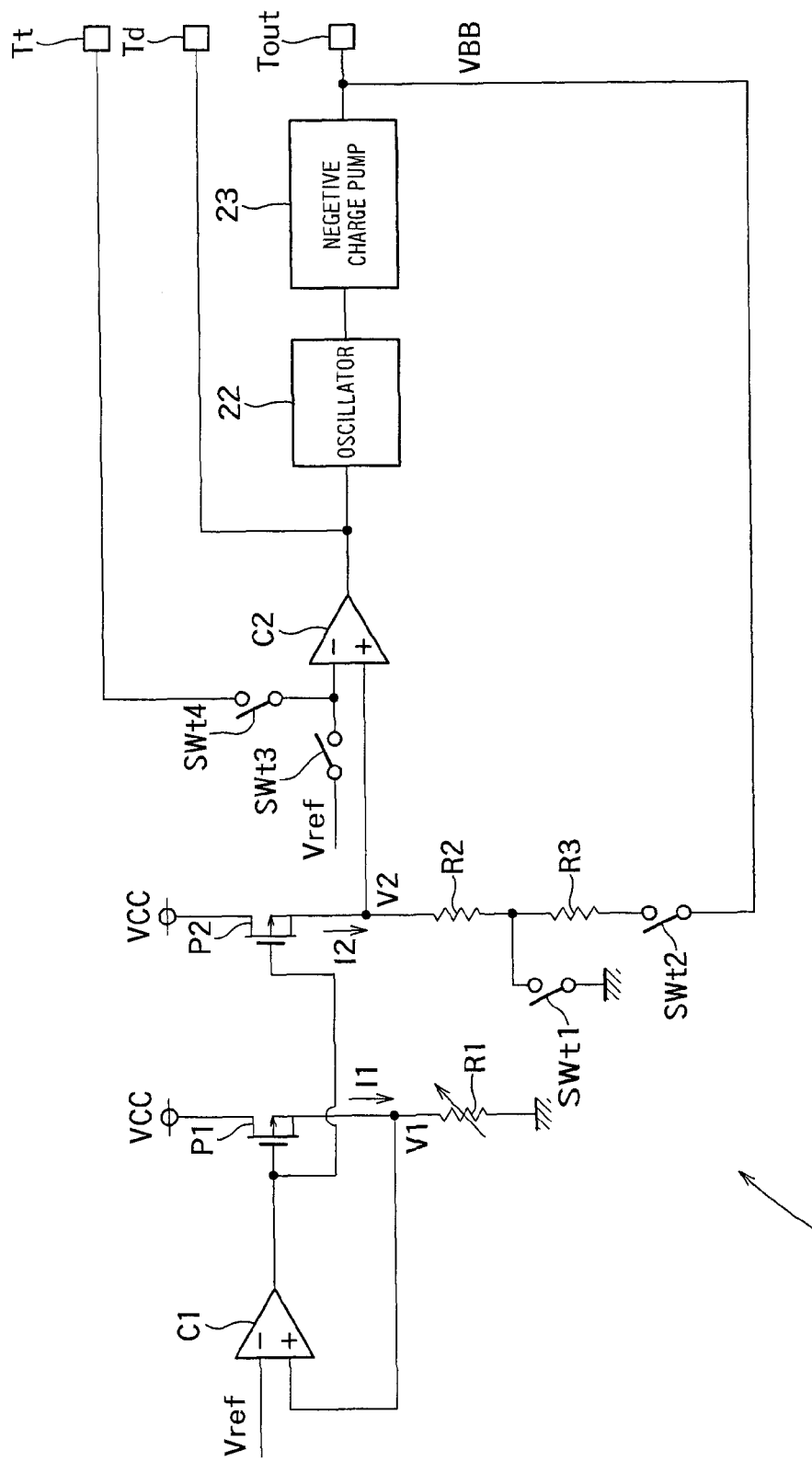
FIG. 9 is a diagram showing an example of a configuration of a semiconductor integrated circuit 18G according to an eighth embodiment.

FIG. 9 is a diagram showing an example of a configuration of a semiconductor integrated circuit 18G according to an eighth embodiment. In FIG. 9, the same reference symbols as those in FIGS. 5 and 7 denote the same components as those in the fourth and sixth embodiments.

As shown in FIG. 9, the semiconductor integrated circuit 18G includes the oscillator 22, the negative charge pump 23 and the negative voltage detecting circuit 21, for example.

As with the semiconductor integrated circuit 18 according to the first embodiment described above, the semiconductor integrated circuit 18G according to the eighth embodiment is applied to the nonvolatile semiconductor storage device 1000 shown in FIG. 2.

Compared with the sixth embodiment, the negative voltage detecting circuit 21 does not include the controlling circuit "CON". The control operation that would otherwise be performed by the controlling circuit "CON" is performed by a testing apparatus (not shown) external to the semiconductor integrated circuit 18G.

As in the sixth embodiment, the negative voltage detecting circuit 21 further includes the detecting pad "Td".

The remainder of the configuration of the semiconductor integrated circuit 18G is the same as those of the semiconductor integrated circuits 18C and 18E according to the fourth and sixth embodiments.

According to the eighth embodiment, in the test, the test reference voltage "Vin" is applied to the test pad "Tt". The test reference voltage "Vin" is supplied to the test pad "Tt" from an external tester (not shown). Then, the testing apparatus turns off the third test switch element "SWt3" and turns on the fourth test switch element "SWt4".

As a result, the test reference voltage "Vin" is supplied to the inverting input terminal of the second comparator "C2".

Furthermore, in the normal operation, the testing apparatus turns on the third test switch element "SWt3" and turns off the fourth test switch element "SWt4".

As a result, in the normal operation, the reference voltage "Vref" is supplied to the inverting input terminal of the second comparator "C2".

In the remainder of the operation of the semiconductor integrated circuit 18C, the external testing apparatus performs the controlling operation instead of the controlling circuit "CON".

The operational characteristics of the semiconductor integrated circuit 18G are the same as those of the semiconductor integrated circuit 18E according to the sixth embodiment.

That is, as with the semiconductor integrated circuit 18D according to the fifth embodiment, the semiconductor integrated circuit 18G according to the eighth embodiment can reduce the pads for outputting the negative voltage for test and the causes of the offset of the negative voltage detecting circuit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
an oscillator that generates and outputs an oscillation signal in an active state and generates no oscillation signal in an inactive state;
a negative charge pump that generates an output voltage that is a negative voltage in response to the oscillation signal and outputs the output voltage to an output pad; and
a negative voltage detecting circuit that detects the output voltage and controls the oscillator to be in the active state or inactive state so as to bring the output voltage close to a target voltage,
the negative voltage detecting circuit comprises:
a first pMOS transistor connected to a power supply at a source thereof;
a first resistor connected to a drain of the first pMOS transistor at a first end thereof and to a ground at a second end thereof;
a first comparator that controls a gate voltage of the first pMOS transistor in such a manner that a first voltage between the first end of the first resistor and the drain of the first pMOS transistor is equal to a reference voltage;
a second pMOS transistor that is connected to the power supply at a source thereof and through which a second current, which is a mirror current of a first current flowing through the first pMOS transistor, flows;
a second resistor connected to a drain of the second pMOS transistor at a first end thereof;
a third resistor connected to a second end of the second resistor at a first end thereof and to the output pad at a second end thereof;
a first test switch element connected to the second end of the second resistor at a first end thereof and to the ground at a second end thereof; and
a second comparator that compares a second voltage between the first end of the second resistor and the drain of the second pMOS transistor with the reference voltage, outputs an activation signal that activates the oscillator if the second voltage is lower than the reference voltage, and outputs a deactivation signal that deactivates the oscillator if the second voltage is equal to or higher than the reference voltage, and
in a test,
the negative voltage detecting circuit turns on the first test switch element to perform such a control as to insulate an output of the negative charge pump and the second end of the third resistor from each other or deactivate the negative charge pump, and then changes a value of the second current so as to switch the output of the second comparator from the activation signal to the deactivation signal or from the deactivation signal to the activation signal, and in a normal operation in which the negative charge pump operates in response to the output of the second comparator, the negative voltage detecting circuit turns off the first test switch element and fixes the value of the second current at a value at the time when the switching of the output of the second comparator occurs in the test.

2. The semiconductor integrated circuit according to claim 1, wherein the negative voltage detecting circuit further comprises a controlling circuit that detects the switching of the output of the second comparator and controls the value of the second current.

3. The semiconductor integrated circuit according to claim 1, wherein the negative voltage detecting circuit further comprises:

a second test switch element connected to the second end of the third resistor and the output pad, and in the test, the negative voltage detecting circuit turns off the second test switch element to perform such a control as to insulate the output of the negative charge pump and the second end of the third resistor from each other, and in the normal operation, the negative voltage detecting circuit turns on the second test switch element to perform such a control as to establish a connection between the output of the negative charge pump and the second end of the third resistor.

4. The semiconductor integrated circuit according to claim 1, wherein the first resistor is a variable resistor, and in the test, the negative voltage detecting circuit controls a resistance of the first resistor to change the first current, thereby changing the value of the second current so as to switch the output of the second comparator from the activation signal to the deactivation signal or from the deactivation signal to the activation signal, and in the normal operation, the negative voltage detecting circuit fixes a value of a current through the first resistor at a value at the time when the switching of the output of the second comparator occurs, thereby fixing the value of the second current at the value at the time when the switching of the output of the second comparator occurs in the test.

5. The semiconductor integrated circuit according to claim 1, wherein the negative voltage detecting circuit further comprises:

a third pMOS transistor connected to the power supply at a source thereof and to the output of the first comparator and a gate of the first pMOS transistor at a gate thereof;

a first nMOS transistor that is connected to a drain of the third pMOS transistor at a drain thereof and to the ground at a source thereof and is diode-connected;

a fourth pMOS transistor connected to the power supply at a source thereof and to a gate of the second pMOS transistor at a gate thereof and is diode-connected;

a second nMOS transistor connected to a drain of the fourth pMOS transistor at a drain thereof and to a gate of the first nMOS transistor at a gate thereof;

a first trimming switch element connected between a source of the second nMOS transistor and the ground;

a third nMOS transistor connected to the drain of the fourth pMOS transistor at a drain thereof and to the gate of the first nMOS transistor at a gate thereof; and a second trimming switch element connected between a source of the third nMOS transistor and the ground, and in the test, the negative voltage detecting circuit performs such a control as to turn on or off the first and second trimming switch elements in such a manner that at least one of the first and second trimming switch element is turned on, thereby changing the value of the second current so as to switch the output of the second comparator from the activation signal to the deactivation signal or from the deactivation signal to the activation signal, and in the normal operation, the negative voltage detecting circuit sets on/off states of the first and second trimming switch elements at states at the time when the switching of the output of the second comparator occurs in the test, thereby fixing the value of the second current at the value at the time when the switching of the output of the second comparator occurs in the test.

6. The semiconductor integrated circuit according to claim 1, further comprising:

a detecting pad that is connected to the output of the second comparator and outputs an output signal of the second comparator to the outside.

7. The semiconductor integrated circuit according to claim 1, wherein the negative voltage detecting circuit further comprises:

a third test switch element that receives the reference voltage at a first end thereof and is connected to a first input of the second comparator at a second end thereof; and a fourth test switch element connected to the first input of the second comparator at a first end thereof and to a test pad at a second end thereof, the first end of the second resistor is connected to a second input of the second comparator, and in the test, a test reference voltage is applied to the test pad, and the third test switch element is turned off and the fourth test switch element is turned on, and in the normal operation, the third test switch element is turned on, and the fourth test switch element is turned off.

8. A nonvolatile semiconductor storage device, comprising:

a positive voltage system that outputs a positive voltage;

a semiconductor integrated circuit that is a negative voltage system that outputs a negative voltage;

a memory cell array in which a plurality of memory cells are arranged in a row direction and a column direction;

a row decoder that selects a row of memory cells;

a column decoder/sense amplifier that selects a column of memory cells; and a voltage switching circuit that selects a positive voltage output and a negative voltage output and supplies the positive voltage output and the negative voltage output to the memory cell array, the row decoder and the column decoder/sense amplifier, wherein the semiconductor integrated circuit comprises:

an oscillator that generates and outputs an oscillation signal in an active state and generates no oscillation signal in an inactive state;

a negative charge pump that generates an output voltage that is a negative voltage in response to the oscillation signal and outputs the output voltage to an output pad; and a negative voltage detecting circuit that detects the output voltage and controls the oscillator to be in the active state or inactive state so as to bring the output voltage close to a target voltage, the negative voltage detecting circuit comprises:

a first pMOS transistor connected to a power supply at a source thereof;

a first resistor connected to a drain of the first pMOS transistor at a first end thereof and to a ground at a second end thereof;

a first comparator that controls a gate voltage of the first pMOS transistor in such a manner that a first voltage between the first end of the first resistor and the drain of the first pMOS transistor is equal to a reference voltage;

a second pMOS transistor that is connected to the power supply at a source thereof and through which a second current, which is a mirror current of a first current flowing through the first pMOS transistor, flows;

a second resistor connected to a drain of the second pMOS transistor at a first end thereof;

a third resistor connected to a second end of the second resistor at a first end thereof and to the output pad at a second end thereof;

a first test switch element connected to the second end of the second resistor at a first end thereof and to the ground at a second end thereof; and a second comparator that compares a second voltage between the first end of the second resistor and the drain of the second pMOS transistor with the reference voltage, outputs an activation signal that activates the oscillator if the second voltage is lower than the reference voltage, and outputs a deactivation signal that deactivates the oscillator if the second voltage is equal to or higher than the reference voltage, and in a test, the negative voltage detecting circuit turns on the first test switch element to perform such a control as to insulate an output of the negative charge pump and the second end of the third resistor from each other or deactivate the negative charge pump, and then changes a value of the second current so as to switch the output of the second comparator from the activation signal to the deactivation signal or from the deactivation signal to the activation signal, and in a normal operation in which the negative charge pump operates in response to the output of the second comparator, the negative voltage detecting circuit turns off the first test switch element and fixes the value of the second current at a value at the time when the switching of the output of the second comparator occurs in the test.

9. The nonvolatile semiconductor storage device according to claim 8, wherein the negative voltage detecting circuit further comprises a controlling circuit that detects the switching of the output of the second comparator and controls the value of the second current.

10. The nonvolatile semiconductor storage device according to claim 8, wherein the negative voltage detecting circuit further comprises:

a second test switch element connected to the second end of the third resistor and the output pad, and in the test, the negative voltage detecting circuit turns off the second test switch element to perform such a control as to insulate the output of the negative charge pump and the second end of the third resistor from each other, and in the normal operation, the negative voltage detecting circuit turns on the second test switch element to perform such a control as to establish a connection between the output of the negative charge pump and the second end of the third resistor.

11. The nonvolatile semiconductor storage device according to claim 8, wherein the first resistor is a variable resistor, and in the test, the negative voltage detecting circuit controls a resistance of the first resistor to change the first current, thereby changing the value of the second current so as to switch the output of the second comparator from the activation signal to the deactivation signal or from the deactivation signal to the activation signal, and in the normal operation, the negative voltage detecting circuit fixes a value of a current through the first resistor at a value at the time when the switching of the output of the second comparator occurs, thereby fixing the value of the second current at the value at the time when the switching of the output of the second comparator occurs in the test.

12. The nonvolatile semiconductor storage device according to claim 8, wherein the negative voltage detecting circuit further comprises:

a third pMOS transistor connected to the power supply at a source thereof and to the output of the first comparator and a gate of the first pMOS transistor at a gate thereof;

a first nMOS transistor that is connected to a drain of the third pMOS transistor at a drain thereof and to the ground at a source thereof and is diode-connected;

a fourth pMOS transistor connected to the power supply at a source thereof and to a gate of the second pMOS transistor at a gate thereof and is diode-connected;

a second nMOS transistor connected to a drain of the fourth pMOS transistor at a drain thereof and to a gate of the first nMOS transistor at a gate thereof;

a first trimming switch element connected between a source of the second nMOS transistor and the ground;

a third nMOS transistor connected to the drain of the fourth pMOS transistor at a drain thereof and to the gate of the first nMOS transistor at a gate thereof; and a second trimming switch element connected between a source of the third nMOS transistor and the ground, and in the test, the negative voltage detecting circuit performs such a control as to turn on or off the first and second trimming switch elements in such a manner that at least one of the first and second trimming switch element is turned on, thereby changing the value of the second current so as to switch the output of the second comparator from the activation signal to the deactivation signal or from the deactivation signal to the activation signal, and in the normal operation, the negative voltage detecting circuit sets on/off states of the first and second trimming switch elements at states at the time when the switching of the output of the second comparator occurs in the test, thereby fixing the value of the second current at the value at the time when the switching of the output of the second comparator occurs in the test.

13. The nonvolatile semiconductor storage device according to claim 8, further comprising:

a detecting pad that is connected to the output of the second comparator and outputs an output signal of the second comparator to the outside.

14. The nonvolatile semiconductor storage device according to claim 8, wherein the negative voltage detecting circuit further comprises:
- a third test switch element that receives the reference voltage at a first end thereof and is connected to a first input of the second comparator at a second end thereof; and
- a fourth test switch element connected to the first input of the second comparator at a first end thereof and to a test pad at a second end thereof,
- the first end of the second resistor is connected to a second input of the second comparator, and in the test,
- a test reference voltage is applied to the test pad, and
- the third test switch element is turned off and the fourth test switch element is turned on, and in the normal operation,
- the third test switch element is turned on, and the fourth test switch element is turned off.

15. The nonvolatile semiconductor storage device according to claim 8, wherein the nonvolatile semiconductor storage device is a NOR-type flash memory.

* * * * *